United States Patent
Funayoshi et al.

(10) Patent No.: US 9,946,173 B2
(45) Date of Patent: Apr. 17, 2018

(54) IMPRINTING APPARATUS, IMPRINTING METHOD, AND ARTICLE MANUFACTURING METHOD

(71) Applicant: CANON KABUSHIKI KAISHA, Tokyo (JP)

(72) Inventors: Tomomi Funayoshi, Utsunomiya (JP); Takuro Yamazaki, Utsunomiya (JP); Masayoshi Fujimoto, Utsunomita (JP); Hiromitsu Yamaguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/082,968

(22) Filed: Mar. 28, 2016

(65) Prior Publication Data

US 2016/0291485 A1 Oct. 6, 2016

(30) Foreign Application Priority Data

Mar. 31, 2015 (JP) ................. 2015-074494

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC .... G03F 7/0002; G03F 9/7042; G03F 9/7003; G03F 9/0703; G03F 7/0015; G03F 7/16; G03F 7/161; G03F 7/2012
See application file for complete search history.

(56) References Cited

U.S. PATENT DOCUMENTS

| | | | | |
|---|---|---|---|---|
| 6,096,155 A | * | 8/2000 | Harden | G02B 6/4206 156/250 |
| 7,165,957 B2 | * | 1/2007 | Montelius | B82Y 10/00 100/258 A |
| 8,562,323 B2 | * | 10/2013 | Ito | B82Y 10/00 425/150 |
| 2002/0145721 A1 | * | 10/2002 | Korenaga | G03F 7/70725 355/75 |
| 2005/0064054 A1 | * | 3/2005 | Kasumi | B82Y 10/00 425/112 |
| 2007/0228593 A1 | * | 10/2007 | Jones | B29C 43/003 264/40.4 |
| 2007/0242272 A1 | * | 10/2007 | Suehira | B41M 3/00 356/401 |

(Continued)

*Primary Examiner* — Jacob T Minskey
*Assistant Examiner* — Taryn Trace Willett
(74) *Attorney, Agent, or Firm* — Canon U.S.A., Inc. IP Division

(57) ABSTRACT

Provided is an imprinting apparatus that forms patterns sequentially on a plurality of areas of a substrate by using a mold and imprint material. The apparatus includes a moving unit configured to move along a horizontal plane while carrying the substrate, and an adjusting unit configured to adjust an inclination of the mold with respect to the substrate. The adjusting unit adjusts the inclination of the mold with respect to the substrate based on information related to a state of the imprint material provided on the substrate and information related to an order of pattern formation. The information related to the state of the imprint material on the substrate is variable with the movement of the moving unit.

4 Claims, 14 Drawing Sheets

(56) References Cited

U.S. PATENT DOCUMENTS

| | | | |
|---|---|---|---|
| 2008/0090160 A1* | 4/2008 | Blackstock | B82Y 10/00 430/30 |
| 2009/0039550 A1* | 2/2009 | Suehira | B29C 33/424 264/319 |
| 2009/0045539 A1* | 2/2009 | Yoneda | B29C 59/022 264/40.5 |
| 2010/0052217 A1* | 3/2010 | Kasumi | B82Y 10/00 264/293 |
| 2010/0090130 A1* | 4/2010 | Ganapathisubramanian | B82Y 10/00 250/492.1 |
| 2011/0159189 A1* | 6/2011 | Ito | B82Y 10/00 427/277 |
| 2013/0161869 A1* | 6/2013 | Yamamoto | G03F 7/0002 264/293 |
| 2016/0031151 A1* | 2/2016 | Tan | B82Y 40/00 264/40.5 |
| 2016/0193759 A1* | 7/2016 | Hattori | B29C 43/58 264/40.5 |
| 2016/0288403 A1* | 10/2016 | Schumaker | G03F 7/0002 |
| 2016/0297136 A1* | 10/2016 | Wakabayashi | G03F 7/0002 |
| 2016/0354969 A1* | 12/2016 | Baba | G03F 7/0002 |

\* cited by examiner

DIRECTION OF MOVEMENT OF STAGE

DIRECTION OF MOVEMENT OF STAGE

PLANE AT TOP OF
IMPRINT MATERIAL

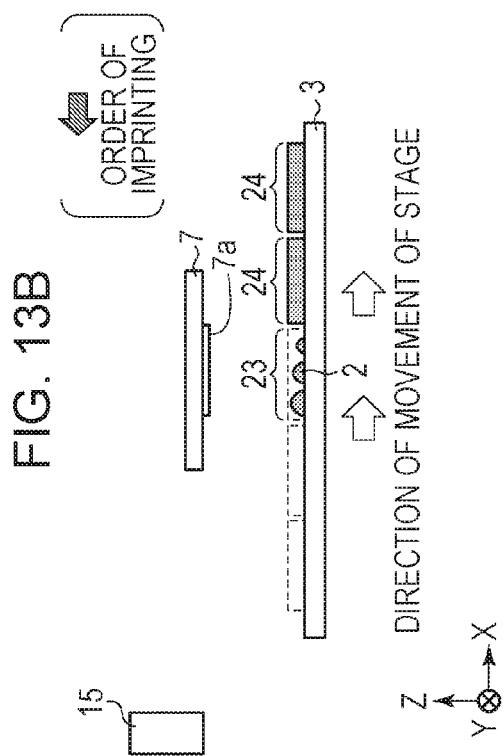
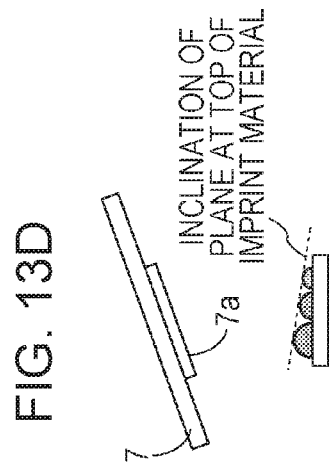
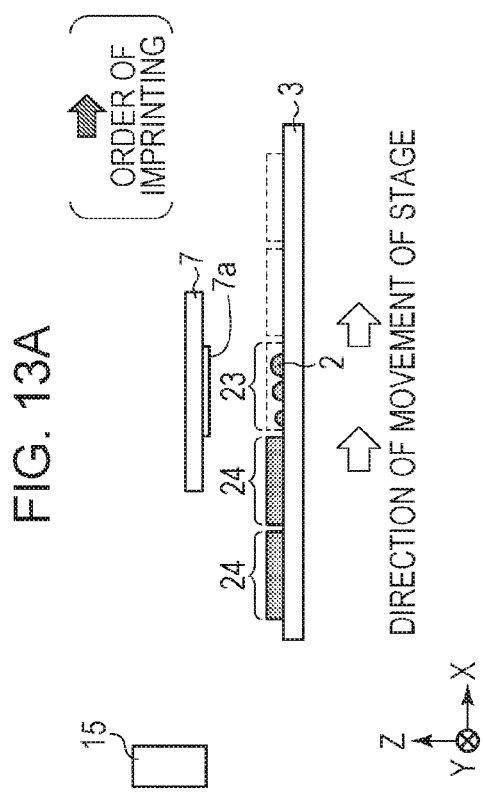
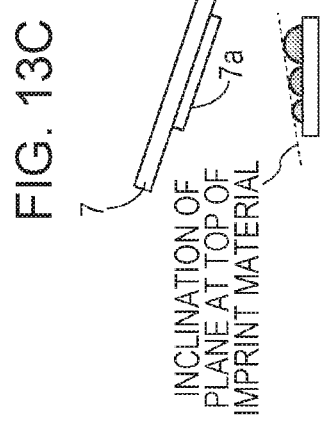

IMPRINTING APPARATUS, IMPRINTING METHOD, AND ARTICLE MANUFACTURING METHOD

BACKGROUND OF THE INVENTION

Field of the Invention

The present invention relates to an imprinting apparatus, an imprinting method, and an article manufacturing method.

Description of the Related Art

An imprinting method is known as a method of forming a microscopic pattern on a substrate so as to manufacture a semiconductor device or the like. In the imprinting method, imprint material (such as light curable resin) is cast into a pattern that is formed on a substrate by using a mold having a relief pattern. If the substrate carrying the pattern is further processed in a state where a residual layer formed at the bottom of the pattern has significantly nonuniform thickness (in a state where the nonuniformity in the thickness of the residual layer is significant), a resulting article may fail to exhibit desired performance.

U.S. Patent Laid-Open No. 2007/0228593 has disclosed a method of reducing the nonuniformity in the thickness of the residual layer. Specifically, new data on the distribution of imprint material to be applied onto the substrate is created in accordance with the nonuniformity in the thickness of the residual layer that has been acquired by measuring the residual layer in a plurality of areas of the pattern formed of the imprint material. For example, a method of creating data on material distribution has been disclosed in which a larger amount of imprint material is applied to areas where the residual layer is expected to be thinner than in other areas.

SUMMARY OF THE INVENTION

The present inventors have found that the uniformity in the thickness of the residual layer is affected by the state of the imprint material that is changeable while the substrate carrying uncured imprint material moves along a horizontal plane. This aspect is not referred to in U.S. Patent Laid-Open No. 2007/0228593.

The present invention provides an imprinting apparatus and an imprinting method in each of which nonuniformity in the thickness of a residual layer is reduced.

According to an aspect of the present invention, there is provided an imprinting apparatus that forms patterns sequentially on a plurality of areas of a substrate by using a mold and imprint material. The apparatus includes a moving unit configured to move along a horizontal plane while carrying the substrate, and an adjusting unit configured to adjust an inclination of the mold with respect to the substrate. The adjusting unit adjusts the inclination of the mold with respect to the substrate based on information related to a state of the imprint material provided on the substrate and information related to an order of pattern formation. The information related to the state of the imprint material on the substrate is variable with the movement of the moving unit.

Further features of the present invention will become apparent from the following description of exemplary embodiments with reference to the attached drawings.

BRIEF DESCRIPTION OF THE DRAWINGS

FIGS. 13A to 13D each illustrate a state of pattern formation.

DESCRIPTION OF THE EMBODIMENTS

First Embodiment (Configuration of Apparatus)

Figure 1:
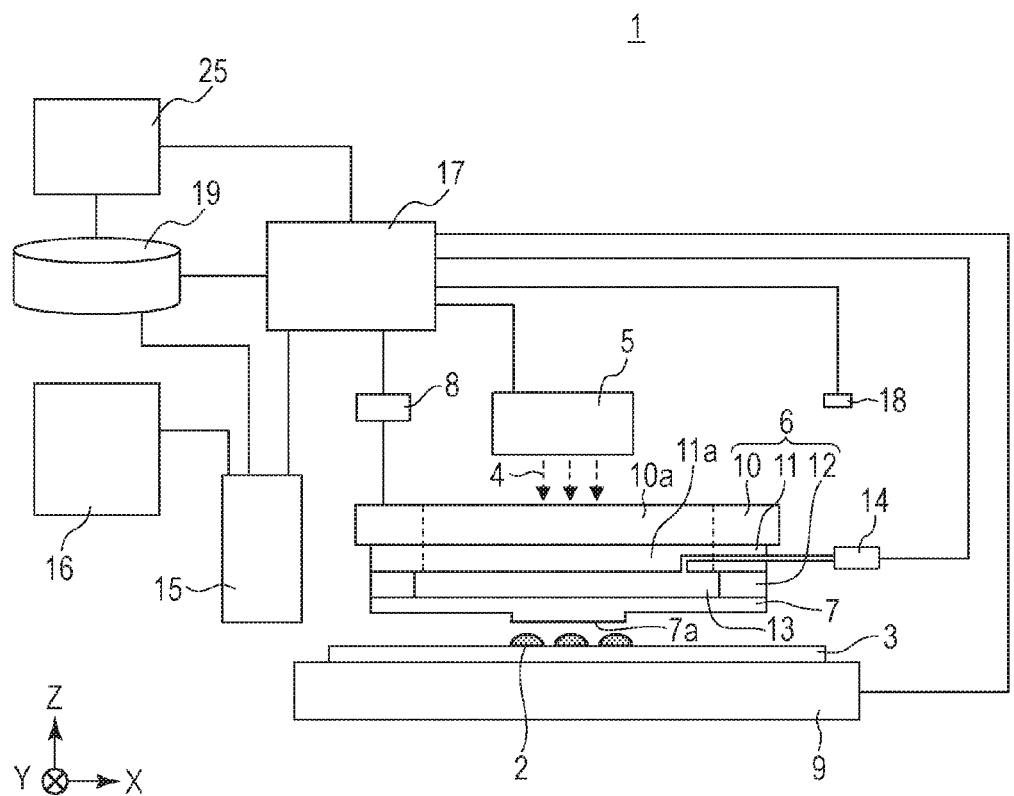
FIG. 1 illustrates an imprinting apparatus according to a first embodiment of the present invention.

FIG. 1 illustrates an imprinting apparatus 1 according to a first embodiment of the present invention. Referring to FIG. 1, a substrate stage 9 carries a substrate 3 such as a wafer and moves along a horizontal plane. The term "horizontal plane" refers to a plane that is perpendicular to the direction of gravitational force. The phrase "to move along the horizontal plane" encompasses a case where the substrate stage 9 moves while inclining with respect to the horizontal plane by a small angle within a range of control error that may occur when the substrate stage 9 is driven. In the first embodiment, a term "information related to the state of imprint material" refers to likely nonuniformity in the thickness of a residual layer 2b (see FIGS. 6A to 6D) included in a pattern formed of imprint material that is estimated from the direction of movement of the substrate stage 9 (the information is hereinafter referred to as "likely residual-layer information"). The likely residual-layer information will be described later.

The imprinting apparatus 1 forms a relief pattern of ultraviolet-curable resin (imprint material) 2 by using a mold 7 and ultraviolet light 4. A light source 5 is a device such as a halogen lamp or a light-emitting diode (LED) and emits the ultraviolet light 4 toward the substrate 3. The light source 5 is provided vertically above (on the +Z side of) a mold stage 6 and applies the ultraviolet light 4 to the imprint material 2 on the substrate 3 through the mold 7.

The mold stage 6 that holds the mold 7 on a side (−Z side) thereof facing the substrate 3 positions the mold 7 while holding the mold 7. The mold 7 has a relief pattern in a central part thereof. A virtual plane defined by connecting the tops of projections of the relief pattern is referred to as pattern surface 7a (a pattern surface of the mold; see FIG. 8). While the first embodiment concerns a case where the mold 7 has a relief pattern for one shot area 20 (see FIGS. 3A and 3B), the mold 7 may have a relief pattern for a plurality of shot areas 20.

The substrate stage (moving unit) 9 that is movable while carrying the substrate 3 having the imprint material 2 applied (supplied) thereto is capable of positioning the substrate 3 in three axial directions including the direction in which the horizontal plane extends. The substrate stage 9 includes a chuck (not illustrated) that holds the substrate 3, a top plate (not illustrated) on which the chuck is mounted, and a driving mechanism (not illustrated) including a motor that moves the top plate in response to a control current supplied thereto from a stage controlling unit 8.

The mold stage (adjusting unit) 6 includes a coarse-adjustment stage 10 that coarsely adjusts the position of the mold 7, a fine-adjustment stage 11 that finely adjusts the position of the mold 7 by units of a smaller length than the coarse-adjustment stage 10 does, and a holding portion 12 that holds the mold 7, which are stacked in that order from the top. The mold 7 can be positioned in six axial directions by the coarse-adjustment stage 10 and the fine-adjustment stage 11. Specifically, the fine-adjustment stage 11 has a function of adjusting the inclination of the mold 7 in accordance with an instruction given thereto from a control unit 17.

The coarse-adjustment stage 10 has an opening 10a in a central part thereof. The fine-adjustment stage 11 has an opening 11a in a central part thereof. The mold 7 is made of a material (such as quartz) that transmits the ultraviolet light 4. Hence, the ultraviolet light 4 emitted from the light source 5 is transmitted through the mold 7 and falls onto the imprint material 2 on the substrate 3. Note that a plate member (not illustrated) that transmits the ultraviolet light 4 is provided between the fine adjustment stage 11 and the holding portion 12.

The holding portion 12 is capable of holding the mold 7 by the use of a vacuum suction force or an electrostatic force. The holding portion 12 has an opening in a central part thereof in such a manner as to hold only a peripheral part of the relief pattern. The opening is provided between the mold 7 and the plate member, whereby a space 13 is provided.

A pressure-adjusting unit 14 communicates with the space 13. The pressure-adjusting unit 14 includes a vacuum pump (not illustrated) and adjusts the pressure in the space 13. When the imprint material 2 and the mold 7 are brought into contact with each other, the pressure in the space 13 is increased, whereby the mold 7 is shaped in such a manner as to project or to be depressed in the vertical direction. Then, the pressure is gradually reduced, so that the recesses in the mold 7 are easily filled with the imprint material 2.

In the following description, to bring the imprint material 2 on the substrate 3 and the mold 7 into contact with each other and fill the mold 7 having the relief pattern with the imprint material 2 (this process is hereinafter referred to as "imprinting"), the mold stage 6 is moved in the Z-axis direction. Alternatively, as long as imprinting is performable, at least one of the mold stage 6 and the substrate stage 9 may be moved in the Z-axis direction.

Figure 2:
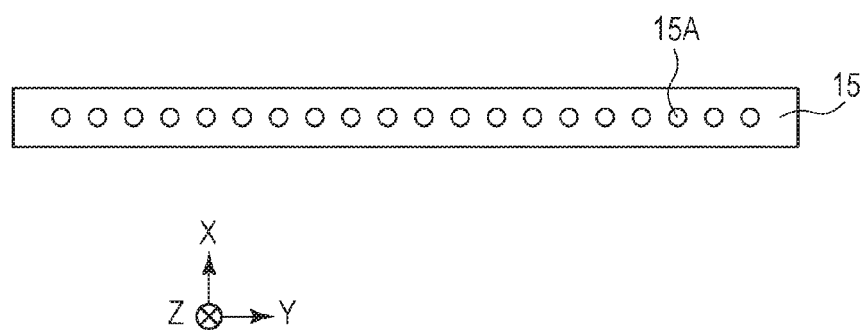
FIG. 2 illustrates a dispenser.

A dispenser (applying unit) 15 applies the imprint material 2 to predetermined positions of the substrate 3 that are defined in accordance with a droplet pattern while receiving the supply of imprint material 2 from a tank 16 that stores uncured imprint material 2. FIG. 2 is a bottom view of the dispenser 15. The dispenser 15 has a line of ejection ports 15A from which the imprint material 2 is ejected. Each of the ejection ports 15A ejects the imprint material 2 toward the substrate 3 by units of a predetermined amount (the unit is hereinafter defined as "drop"). The amount of ejection per drop ranges from subpicoliters to several picoliters.

The dispenser 15 applies the imprint material 2 to an area on the substrate 3 along lines that are at intervals of several micrometers to dozens of micrometers. The dispenser 15 ejects an amount of imprint material 2 that is necessary for a single imprinting action on a single shot area 20 while the substrate 3 is moving below the dispenser 15. Thus, uncured imprint material 2 is applied to a single shot area 20. The term "droplet pattern" (also referred to as "data on material distribution," "application map," or "drop recipe") refers to data representing the droplet layout and the amount of imprint material 2 that is created by a creating unit 25. The droplet pattern is created from pieces of information related to the kind of the mold 7, the dispenser 15, and so forth.

The control unit 17 includes a central processing unit (CPU), a random access memory (RAM), a hard disk drive (HDD), and so forth. The control unit 17 generally controls a series of operations that are performed for forming a relief pattern made of the imprint material 2 (hereinafter referred to as "imprinting process"). For example, the control unit 17 notifies the target position of the mold stage 6 in the horizontal direction, the target inclination of the mold stage 6, and the target position of the substrate stage 9; instructs the light source 5 to emit the ultraviolet light 4 toward the substrate 3 at a predetermined timing; reads a desired droplet pattern from a storage unit 19 storing different droplet patterns; transmits the droplet pattern to the dispenser 15; and notifies the pressure-adjusting unit 14 of a target pressure to be generated during the imprinting process.

A measuring device 18 is a focus measuring instrument that measures irregularities in the surface of the substrate 3 that is carried into the imprinting apparatus 1.

The storage unit 19 stores relief patterns of the mold 7, droplet patterns to be set on the dispenser 15, information related to imprinting atmosphere, and information related to the direction of movement of the substrate stage 9. The information related to imprinting atmosphere is a set of pieces of information related to the ambient temperature, the air current, and the oxygen concentration around the location where imprinting is performed, the kind of the imprint material 2, the volatility of the imprint material 2, and so forth.

The information related to the direction of movement of the substrate stage 9 represents the direction in which the substrate 3 to which the imprint material 2 has been applied moves from a position facing the dispenser 15 (a position facing the applying unit) to a position facing the mold 7 (hereinafter referred to as "imprinting position") where imprinting is to be performed.

The storage unit 19 according to the first embodiment further stores the likely residual-layer information that correlates with the information related to the direction of movement of the substrate stage 9. The likely residual-layer information indicates likely nonuniformity in the thickness of the residual layer 2b that is estimated from the information related to the direction of movement of the substrate stage 9. The storage unit 19 stores a program, summarized as a flow chart in FIG. 7, for performing the imprinting process on all of the shot areas 20 of the substrate 3.

Figure 3A:
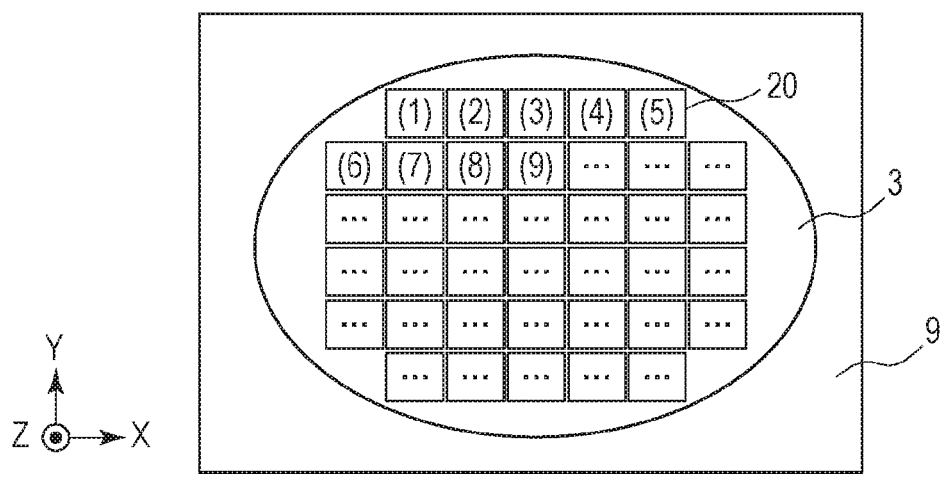
FIGS. 3A and 3B each illustrate an order of imprinting.
Figure 3B:
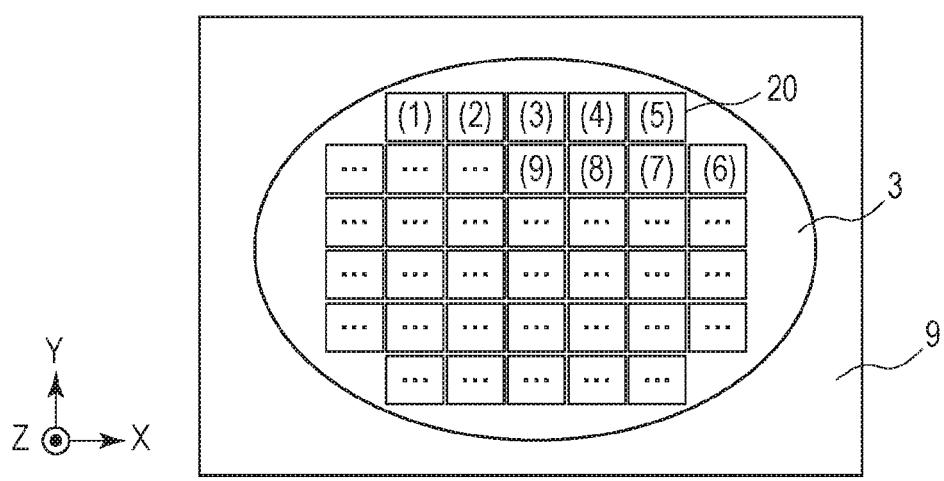
Figure 4:
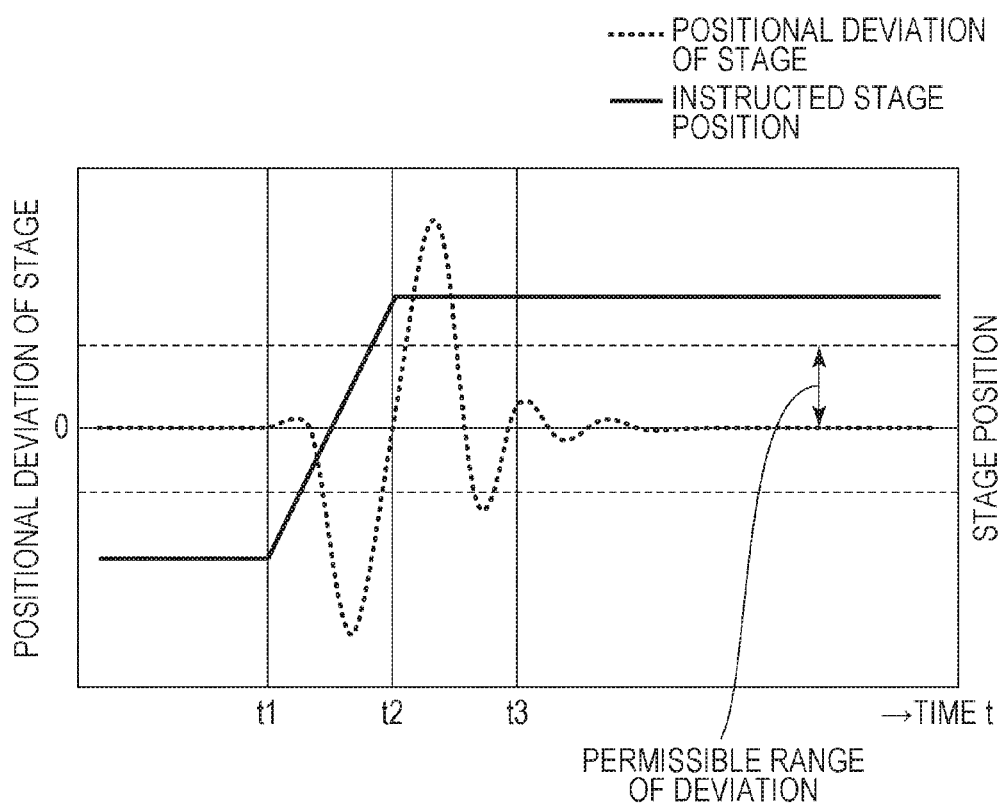
FIG. 4 is a graph illustrating positional deviation of a substrate stage from an instructed position.

Now, how the substrate stage 9 moves will be described with reference to FIGS. 3A, 3B, 4, 5A to 5F, and 6A to 6D. FIGS. 3A and 3B each illustrate an order of imprinting (information related to the order of pattern formation). The plurality of shot areas 20 each having a rectangular shape are objects of pattern formation in the imprinting process. The numbers in parentheses given in the respective shot areas 20 represent the order of imprinting. Specifically, in the case illustrated in FIG. 3A, patterns start to be formed on shot areas 20 in the first row sequentially in the +X direction, and then on shot areas 20 in the second row sequentially in the +X direction.

In the case illustrated in FIG. 3B, patterns start to be formed on shot areas 20 in the first row sequentially in the +X direction, and then on shot areas 20 in the second row sequentially in the −X direction. After the completion of every imprinting action, the substrate stage 9 moves from the position facing the mold 7 to the position facing the dispenser 15.

The substrate stage 9 is positioned with a delay in response to a control command (a command that indicates the target position with respect to time) issued thereto. In the graph illustrated in FIG. 4, the horizontal axis represents time, and the vertical axis represents the instructed position of the substrate stage 9 for the solid line and the positional deviation of the substrate stage 9 from the instructed position (the positional error of the substrate stage 9 with respect to the instructed position) for the dotted line. The graph shows that, for example, even if the substrate stage 9 is instructed to start to move at time t1 and to stop at time t2, the substrate stage 9 is not stabilized at time t2 but the positional deviation of the substrate stage 9 falls into a permissible range of deviation at time t3.

Figure 5A:
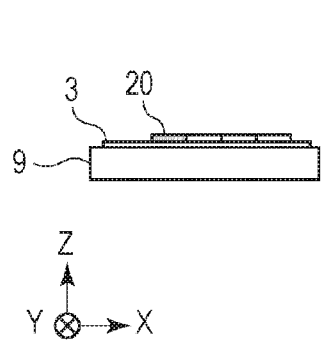
FIGS. 5A to 5F illustrate a relationship between the direction of movement of the substrate stage and the inclination of the substrate stage.
Figure 5B:
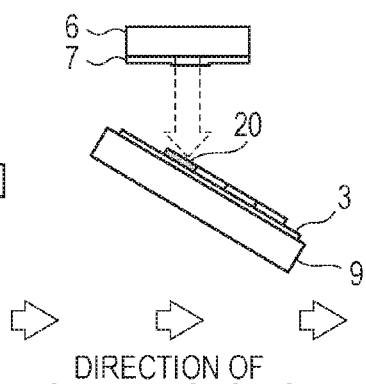
Figure 5C:
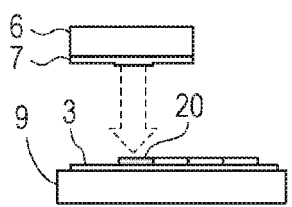
Figure 5F:
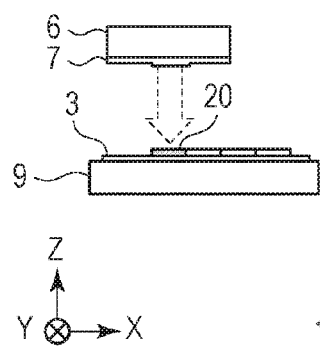
Figure 5E:
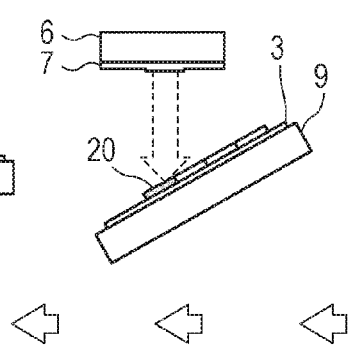
Figure 5D:
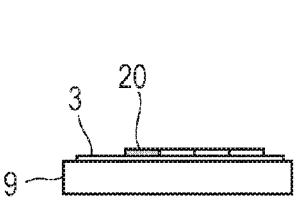
Figure 6A:
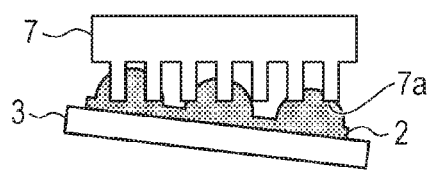
FIGS. 6A to 6D each illustrate a residual layer formed as a result of imprinting.
Figure 6B:
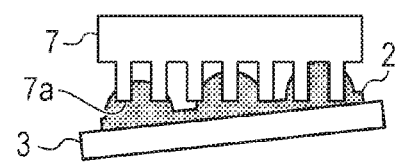
Figure 6C:
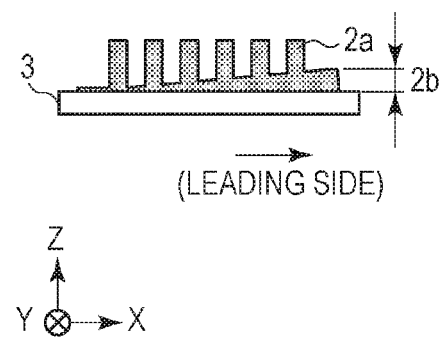
Figure 6D:
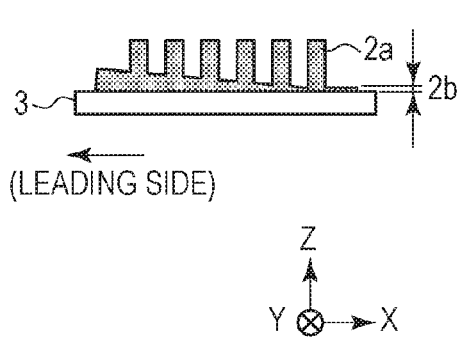

FIGS. 5A to 5F illustrate the direction of movement of the substrate stage 9 and the inclination of the substrate stage 9. FIGS. 5A and 5D each illustrate a state of the substrate stage 9 during a period from time t1 to time t2. FIGS. 5B and 5E each illustrate a state of the substrate stage 9 during a period from time t2 to time t3. FIGS. 5C and 5F each illustrate a state of the substrate stage 9 after time t3. As illustrated in FIGS. 5B and 5E, the substrate stage 9 moving in the +X direction tends to incline slightly such that the +X side thereof is positioned lower than the other side thereof, and the substrate stage 9 moving in the −X direction tends to incline slightly such that the −X side thereof is positioned lower than the other side thereof.

In the first embodiment, the control unit 17 puts the priority on the throughput and controls the mold stage 6 such that imprinting is performed during the period from time t2 to time t3. The imprint material 2 and the mold 7 are brought into contact with each other while the substrate 3 is inclined downward on the leading side (see FIG. 6A or 6B). Consequently, a residual layer 2b whose thickness is significantly nonuniform is formed at the bottom of patterned imprint material 2a (hereinafter referred to as "imprint-material pattern 2a"; see FIG. 6C or 6D). The residual layer 2b refers to a layer of imprint material 2 that is formed at the bottom (in the recesses) of the imprint-material pattern 2a in the imprinting process. That is, the residual layer 2b refers to a layer formed between the substrate 3 and the bases of the recesses of the resulting imprint-material pattern 2a.

The information related to the direction of movement of the substrate stage 9 that is used in the first embodiment indicates the direction in which the substrate stage 9 moves from the position facing the dispenser 15 to the position where imprinting is performed. That is, in the case of the imprinting apparatus 1, the direction of movement of the substrate stage 9 is the +X direction. The likely residual-layer information according to the first embodiment is the information indicating that the residual layer 2b is likely to be thicker on the leading side (+X side) than on the trailing side (−X side) that is opposite the leading side in a single shot area 20 (see FIGS. 5A to 5F and 6A to 6D). The trailing side is opposite the leading side.

(Flow of Imprinting Process)

Figure 7:
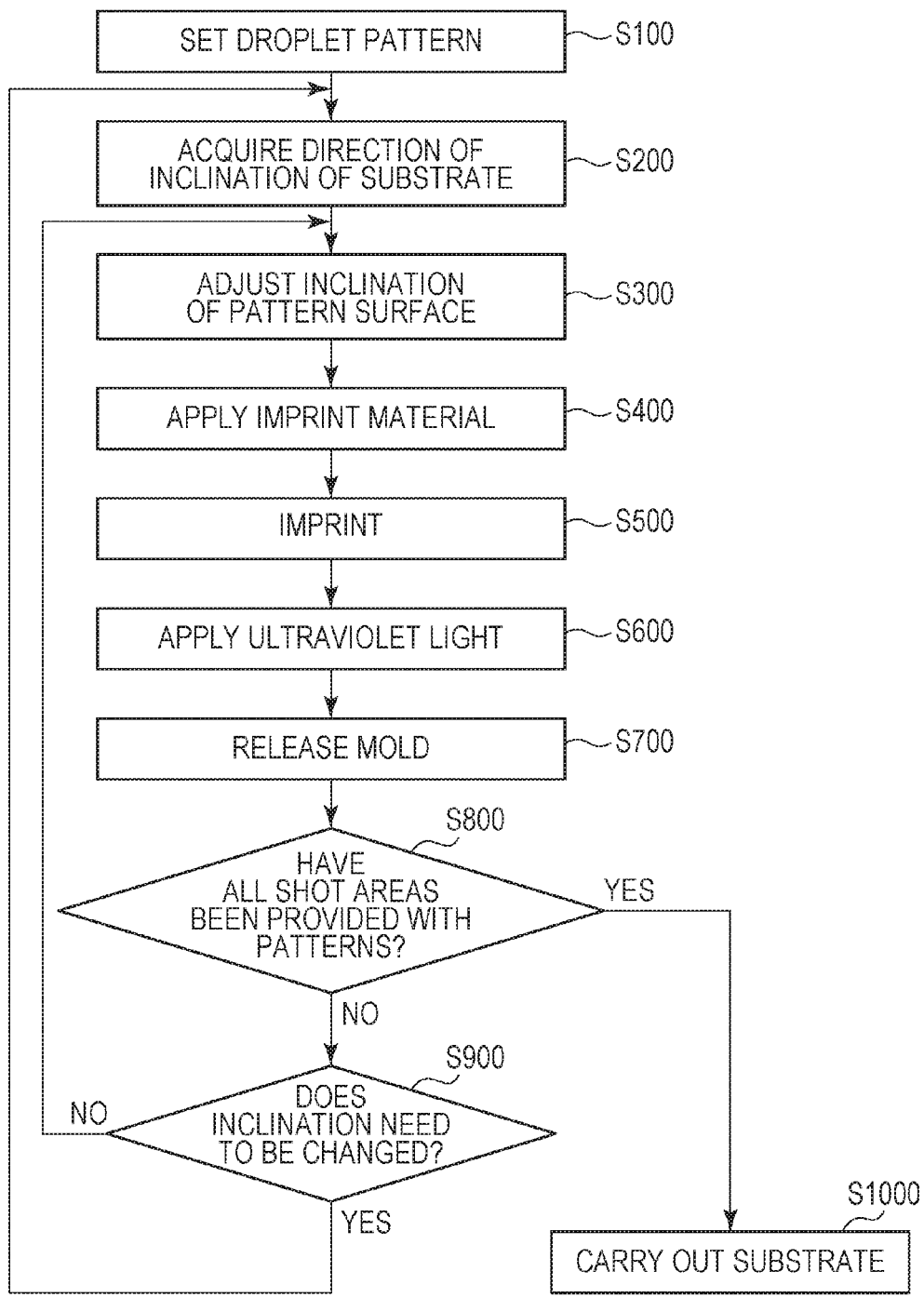
FIG. 7 is a flow chart illustrating an imprinting process according to the first embodiment.
Figure 8:
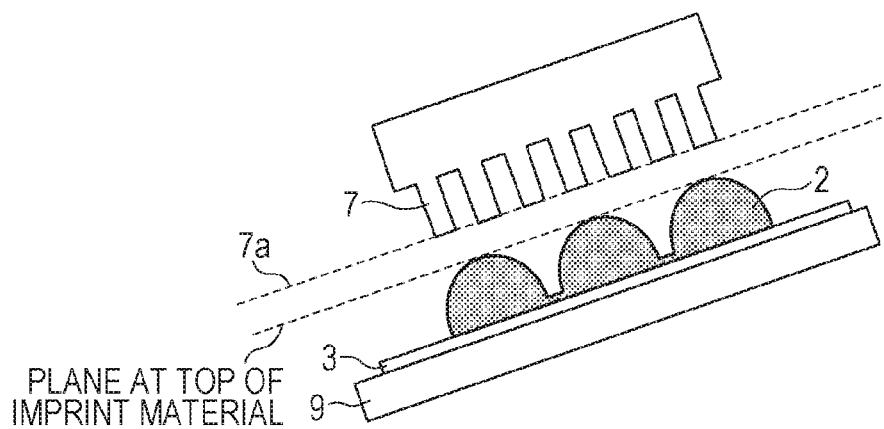
FIG. 8 illustrates a state where the inclination of a mold has been adjusted.

A flow of the imprinting process according to the first embodiment will now be described with reference to FIGS. 7 and 8. FIG. 7 is a flow chart illustrating a program of the imprinting process. When the control unit 17 runs the program illustrated in FIG. 7, the imprinting process is performed. The first embodiment is to reduce the variation, i.e., the nonuniformity, in the thickness of the residual layer 2b that may occur mainly because the substrate stage 9 inclines while being positioned. In the first embodiment, the inclination of a virtual plane connecting the tops of the droplets of imprint material 2 (hereinafter referred to as "plane at the top of the imprint material 2") is made the same as the inclination of the substrate 3.

First, in step S100, the control unit 17 recognizes the pattern of the mold 7 mounted on the mold stage 6 and sets an appropriate droplet pattern, which is stored in the storage unit 19, on the dispenser 15.

In step S200, the control unit 17 acquires the direction of inclination of the substrate 3 at the time of imprinting on the basis of the information related to the direction of movement of the substrate 3 carrying the imprint material 2 and moving toward the imprinting position. In the imprinting apparatus 1 according to the first embodiment, the substrate stage 9 moves from the position facing the dispenser 15 to the imprinting position, i.e., in the +X direction. Hence, the substrate stage 9 inclines such that the leading side thereof is lowered. With such an inclination of the substrate stage 9, the plane at the top of the imprint material 2 also inclines such that the +X side (leading side) thereof is lowered.

In step S300, on the basis of the above information, the mold stage 6 adjusts the inclination of the mold 7 such that the direction of inclination of the substrate 3 and the direction of inclination of the pattern surface 7a become the same and as parallel to each other as possible. The mold 7 is inclined such that the angle formed between the plane at the top of the imprint material 2 and the pattern surface 7a is reduced: that is, the +X side of the pattern surface 7a of the mold 7 is lowered.

In step S400, the dispenser 15 applies uncured imprint material 2 onto the substrate 3. When the substrate 3 has moved from the position facing the dispenser 15 to the imprinting position, the process proceeds to step S500, in which imprinting is performed at a predetermined timing with the mold 7 inclined at an angle adjusted in step S300. The predetermined timing is a point of time (between time t2 and time t3) before the positional deviation of the substrate stage 9 falls into the permissible range. After the recesses of the mold 7 are filled with the imprint material 2, the process proceeds to step S600, in which the light source 5 applies the ultraviolet light 4 to the imprint material 2 for a predetermined period of time, whereby the imprint material 2 that has been uncured is cured. In step S700, the mold stage 6 releases the mold 7.

Thus, an imprint-material pattern 2a is formed on the substrate 3. In step S800, the control unit 17 checks if all of the shot areas 20 of the substrate 3 have been provided with respective patterns. If so (YES), the process proceeds to step S1000, in which the control unit 17 allows the substrate 3 to be carried out.

If there are any shot areas 20 provided with no patterns (NO), the process proceeds to step S900, in which the control unit 17 selects one of such shot areas 20 and checks if the inclination of the mold 7 needs to be changed in performing imprinting on that shot area 20.

The inclination of the mold 7 needs to be changed if, for example, the direction of movement of the substrate stage 9 in a shot area 20 that is to undergo imprinting next is different from the direction of movement of the substrate stage 9 in another shot area 20 that has undergone imprinting last time. If the inclination needs to be changed, steps S200 to S900 are performed again. If the inclination does not need to be changed, steps S300 to S900 are performed again so that the inclination of the pattern surface 7a of the mold 7 is adjusted to be the same as the inclination acquired in step S200. Regarding the next substrate 3 and substrates 3 included in the next lot also, the control unit 17 acquires the direction of inclination of the mold 7 and causes the mold stage 6 to adjust the inclination of the mold 7 according to need.

The inclination may be newly set after every formation of patterns on a predetermined number of shot areas 20 or after every processing of a single substrate 3, by acquiring information related to any defective-pattern inspection or any information related to irregular-pattern detection supplied from the inside or the outside of the imprinting apparatus 1. The defective-pattern information refers to the result of any measurement of the accuracy in the transfer of the pattern to the imprint material 2 and is acquired by an inspection device (not illustrated). The information related to irregular-pattern detection includes pieces of information indicating any irregularity in the force of pressing or releasing the mold 7, the presence of any impurities taken in during the imprinting process, the exceeding of a predetermined number of times of use of the mold 7, and so forth.

As described above, in the first embodiment, the mold stage 6 adjusts the inclination of the mold 7 on the basis of the direction of movement of the substrate stage 9. The direction of inclination of the mold 7 is adjusted such that the nonuniformity in the thickness of the residual layer 2b included in the resulting pattern is reduced: that is, the angle formed between the pattern surface 7a and the plane at the top of the imprint-material pattern 2a is reduced. Thus, the nonuniformity in the thickness of the residual layer 2b included in the imprint-material pattern 2a can be made lower (the uniformity in the thickness of the residual layer 2b can be made higher) than in a case where the first embodiment is not applied.

The inclination of the pattern surface 7a refers to the inclination of the pattern surface 7a in a state where the pressure in the space 13 is substantially equal to the atmospheric pressure (encompassing the inclination of a plane that is tangent to the center of the pattern surface 7a). If the substrate stage 9 changes its direction of movement, the inclination of the mold 7 is adjusted in accordance with the new direction of movement of the substrate stage 9, because the plane at the top of the imprint material 2 inclines downward on the leading side of the substrate stage 9.

Note that the inclination of the substrate stage 9 may be different between that observed when imprinting is performed on a shot area 20 near the edge of the substrate 3 and that observed when imprinting is performed on a shot area 20 near the center of the substrate 3. Therefore, the angle formed between the substrate stage 9 and the substrate 3 may be different between that in a shot area 20 near the edge of the substrate 3 and that in a shot area 20 near the center. In such a case, the inclination of the mold 7 may be adjusted on the basis of the position of the shot area 20 of interest on the substrate 3, because the likely residual layer information correlates with the length of movement of the substrate stage 9 from the position facing the dispenser 15 to the imprinting position.

If the substrate 3 having the imprint material 2 and moving away from the position facing the dispenser 15 moves to the imprinting position without taking the shortest route, the information related to the direction of movement of the substrate stage 9 may indicate a direction in which the substrate stage 9 moves from a position of the last stop to the imprinting position.

Second Embodiment

In a second embodiment of the present invention, the degree of inclination of the substrate stage 9 is acquired from the current for controlling a motor of the substrate stage 9 (hereinafter also referred to as "stage controlling current"). The stage controlling current also correlates with the direction of movement of the substrate stage 9 and the level of the force for moving the substrate stage 9. The direction of inclination of the plane at the top of the imprint material 2 according to the second embodiment corresponds to, for example, the direction of inclination of the substrate stage 9, as in the first embodiment.

Figure 9:
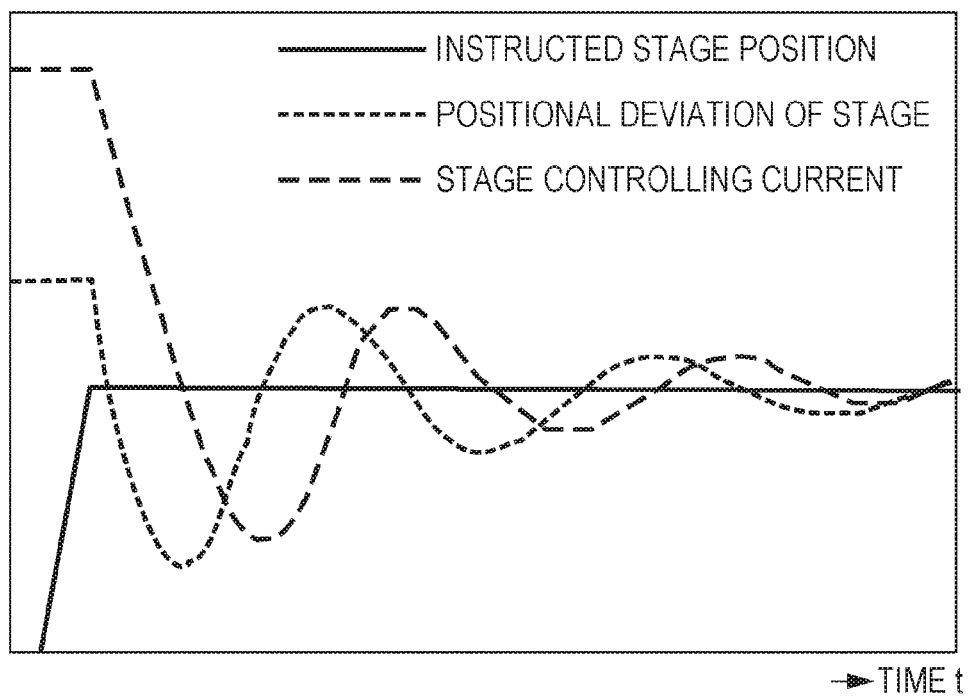
FIG. 9 is a graph illustrating a current for controlling the substrate stage.

FIG. 9 is a graph illustrating a relationship between the positional deviation of the substrate stage 9 and the current for controlling the substrate stage 9. The horizontal axis represents time, and the vertical axis represents the instructed position of the substrate stage 9 (the solid line), the positional deviation of the substrate stage 9 from the instructed position with respect to time (the dotted line), and the current for controlling the substrate stage 9 with respect to time (the broken line). As graphed in FIG. 9, the positional deviation of the substrate stage 9 and the stage controlling current tend to change with a similar amplitude but with a certain time lag therebetween. Hence, while the stage controlling unit 8 acquires the stage controlling current in real time, the control unit 17 calculates the positional deviation of the substrate stage 9 from the acquired stage controlling current, whereby the inclination of the substrate stage 9 can be estimated from the calculated positional deviation of the substrate stage 9. Thus, the mold stage 6 can adjust the inclination of the mold 7.

In the second embodiment, since the inclination is adjusted in real time on the basis of the actual measurements of the substrate stage 9 that are acquired by using the stage controlling current, the pattern surface 7a of the mold 7 and the plane at the top of the imprint material 2 can be made as parallel to each other as possible with high accuracy. Since imprinting is performed with the adjusted inclination, the nonuniformity in the thickness of the residual layer 2b is reduced.

Third Embodiment

Figure 10A:
FIGS. 10A and 10B illustrate a factor affected by the flatness of a substrate.

In a third embodiment of the present invention, the likely residual-layer information is acquired on the basis of the direction of movement of the substrate stage 9 and information related to surface irregularities (the flatness) of the substrate 3 (irregularity information). If the substrate 3 is not flat as illustrated in FIG. 10A, the plane at the top of the imprint material 2 does not become flat, conforming to the shape of the substrate 3. Hence, the control unit 17 causes the measuring device 18 to measure surface positions of the substrate 3 with respect to the measuring device 18 and thus acquires information related to surface irregularities of the substrate 3.

Figure 10B:
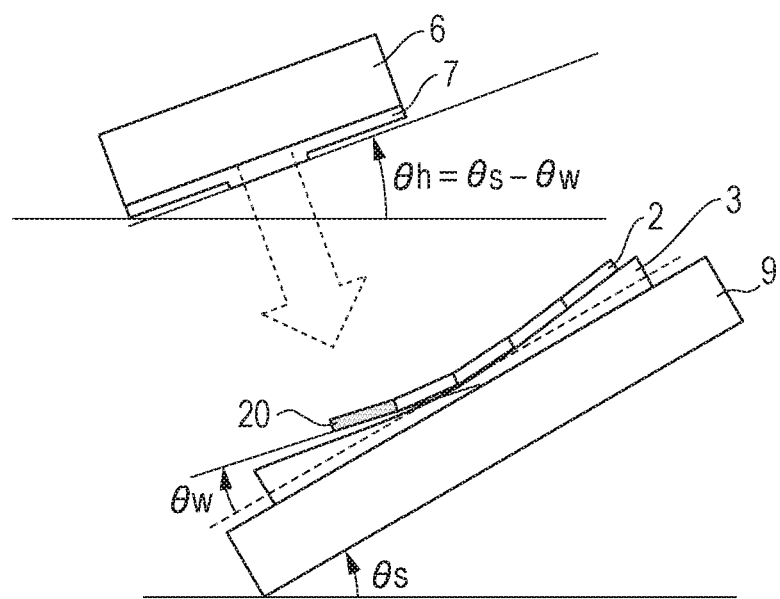

FIG. 10B illustrates an exemplary control method. If the substrate stage 9 is at an angle $\theta s$ with respect to the horizontal plane and a shot area 20 of interest on the substrate 3 is at an angle $-\theta w$ with respect to the substrate stage 9, the mold 7 is inclined with respect to the horizontal plane by an angle θh=θs+(−θw). Thus, the pattern surface 7a of the mold 7 and the plane at the top of the imprint material 2 are made as parallel to each other as possible, and the nonuniformity in the thickness of the residual layer 2b is reduced.

Figure 11A:
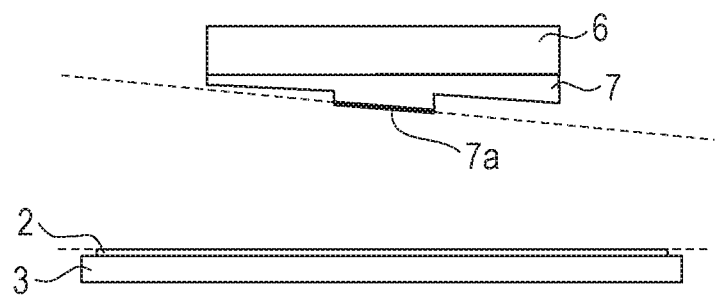
FIGS. 11A and 11B illustrate a difference caused by the inclination of an imprinting surface of the mold.
Figure 11B:
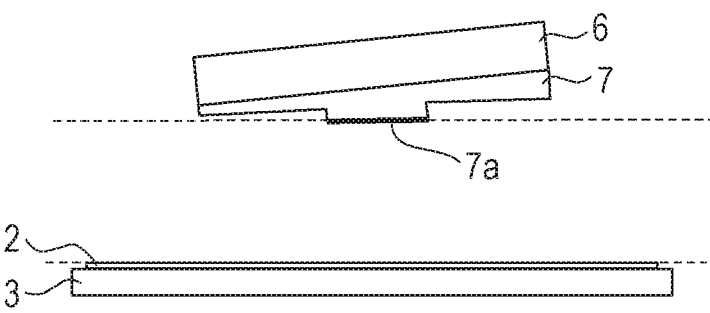

If the pattern surface 7a is inclined with respect to the mold 7 (as illustrated in FIG. 11A), the inclination of the mold 7 may be adjusted such that the angle formed between the pattern surface 7a and the plane at the top of the imprint material 2 is reduced (as illustrated in FIG. 11B), taking into account such inclination of the pattern surface 7a.

As described above, in the third embodiment, the inclination of the mold 7 with respect to the substrate 3 is adjusted such that a leading-side portion of the pattern surface 7a of the mold 7 is positioned closer to the substrate stage 9 than a trailing-side portion of the pattern surface 7a.

Fourth Embodiment

In a fourth embodiment of the present invention, the information related to the state of the imprint material 2 corresponds to the likely residual-layer information, or may be information related to the state of the imprint material 2 while the substrate stage 9 is moving. The information related to the state of the imprint material 2 while the substrate stage 9 is moving correlates with the likely residual-layer information. The state of the imprint material 2 refers to, for example, the inclination of the plane at the top of the imprint material 2 (the surface of the imprint material 2 that is to be shaped) on the substrate 3 or the direction of inclination of the plane at the top of the imprint material 2.

Information related to the order of pattern formation according to the fourth embodiment corresponds to the order of imprinting: that is, as illustrated in FIGS. 3A and 3B, information indicating in what number of order each of the shot areas 20 undergoes pattern formation.

The inclination of the plane at the top of the imprint material 2 according to the fourth embodiment is defined as follows. The average of the heights, from the substrate stage 9, of a plurality of droplets that are at the same position in the X direction is calculated for each of different X-direction positions. Then, points at the average heights of a plurality of droplets that are aligned in the X direction are connected by a virtual line. The inclination of the plane at the top of the imprint material 2 is the inclination of the virtual line. The likely direction of inclination of the plane at the top of the imprint material 2 corresponds to, for example, the level difference between the leading side of the substrate stage 9 and the trailing side of the substrate stage 9.

Figure 12:
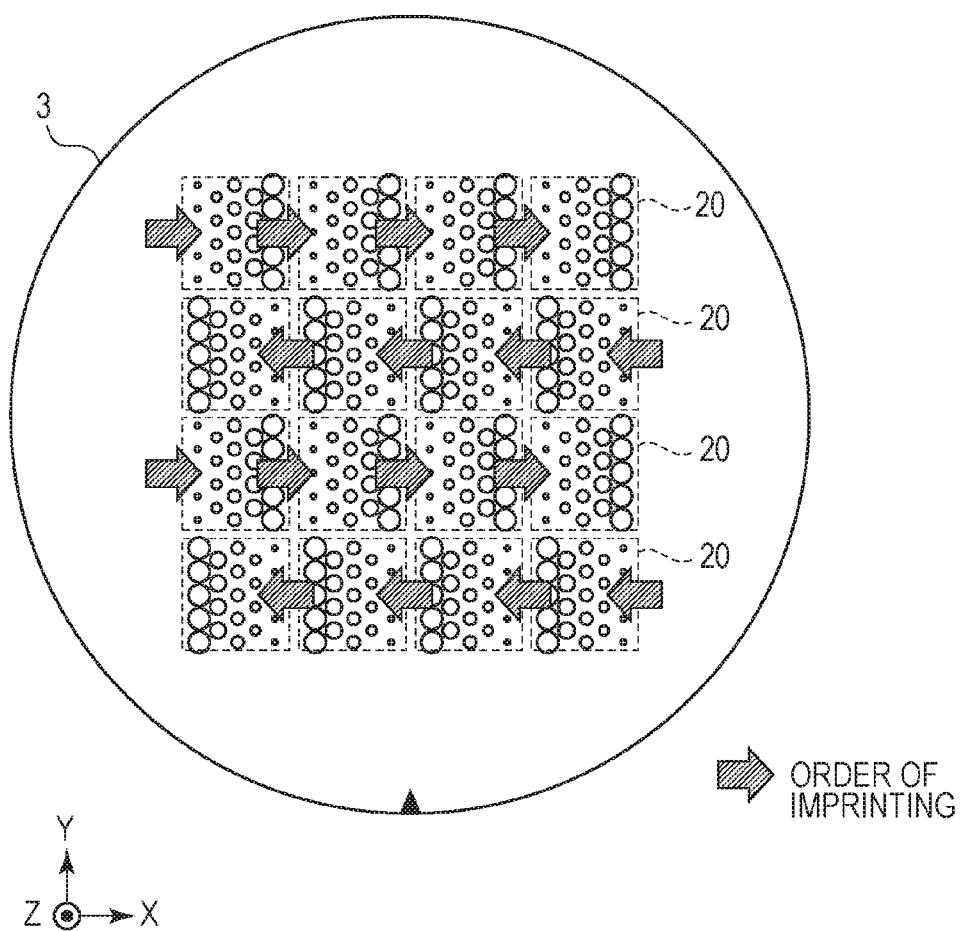
FIG. 12 illustrates a relationship between the order of imprinting and the thickness of the residual layer.

In the imprinting apparatus 1 according to the fourth embodiment, the mold stage 6 adjusts the inclination of the mold 7 on the basis of the order of imprinting and the likely residual-layer information that correlates with the order of imprinting. Even if the direction of movement of the substrate stage 9 from the position facing the dispenser 15 to the imprinting position is constant, the state of the residual layer 2b may be inconstant regardless of the order of imprinting, because the state of the residual layer 2b may be affected by factors such as the air current in the imprinting apparatus 1 or the air current occurring with the movement of the substrate stage 9. The fourth embodiment is advantageous in such a case. FIG. 12 illustrates a relationship between the order of imprinting and the likely residual-layer information in a case where the imprint-material pattern 2a is formed in the order of imprinting that is illustrated in FIG. 3B. The size of circles drawn in each of a plurality of shot areas 20 corresponds to the thickness of the residual layer 2b. Specifically, the larger the circle, the thicker the residual layer 2b.

FIGS. 13A and 13B each illustrate a relationship between the order of imprinting and the state of pattern formation. A shot area 23 (a first area) has the imprint material 2 but is yet to undergo pattern formation. On the other hand, shot areas 24 (second areas) each have an imprint-material pattern 2a. In FIGS. 13A and 13B, the states of the droplets of imprint material 2 on the shot area 23 have changed because of volatilization that has occurred while the substrate stage 9 has been moving.

Referring to FIG. 12, in the first row, patterns are formed sequentially toward the leading side (+X side). That is, as illustrated in FIG. 13A, the substrate stage 9 moves with the shot area 23 being on the leading side of the substrate stage 9 with respect to the shot areas 24.

The droplets of imprint material 2 at the imprinting position have different heights because of volatilization or the like. Specifically, the plane at the top of the imprint material 2 inclines such that droplets on a side nearer to the shot areas 24 tend to be lower than droplets on a side farther from the shot areas 24. In such a case, the likely residual-layer information indicates that the residual layer 2b tends to be thicker on the leading side (a side nearer to the destination) of the substrate stage 9 than on the trailing side (a side farther from the destination) of the substrate stage 9.

Referring to FIG. 12, in the second row, patterns are formed sequentially toward the trailing side (−X side). That is, as illustrated in FIG. 13B, the substrate stage 9 moves with the shot areas 24 being on the leading side of the substrate stage 9 with respect to the shot area 23.

The droplets of imprint material 2 at the imprinting position have different heights. Specifically, the plane at the top of the imprint material 2 inclines such that droplets on a side nearer to the shot areas 24 tend to be lower than droplets on a side farther from the shot areas 24. In such a case, the likely residual-layer information indicates that the residual layer 2b tends to be thinner on the leading side of the substrate stage 9 than on the trailing side of the substrate stage 9.

The mold stage 6 adjusts the inclination of the mold 7 on the basis of the likely residual-layer information and the order of imprinting that correlates with the likely residual-layer information (on the basis of information related to the state of the imprint material 2 that variable with the movement of the moving unit). The mold stage 6 inclines the mold 7 such that the pattern surface 7a is inclined in the direction opposite to the direction of inclination of the plane at the top of the imprint material 2. That is, in the case illustrated in FIG. 13A, the mold 7 is inclined such that the gap between the leading-side portion of the pattern surface 7a and the substrate stage 9 becomes smaller than the gap between the trailing-side portion of the pattern surface 7a and the substrate stage 9.

If the substrate stage 9 is moved in the state illustrated in FIG. 13A where the shot area 23 is on the leading side of the substrate stage 9 with respect to the shot areas 24, the mold 7 is inclined such that the leading side of the pattern surface 7a becomes lower than the trailing side of the pattern surface 7a (as illustrated in FIG. 13C).

If the substrate stage 9 is moved in the state illustrated in FIG. 13B where the shot area 23 is on the trailing side of the substrate stage 9 with respect to the shot areas 24, the mold 7 is inclined such that the leading side of the pattern surface 7a becomes higher than the trailing side of the pattern surface 7a (as illustrated in FIG. 13D).

As described above, the mold stage 6 adjusts the inclination of the mold 7 on the basis of the likely residual-layer information and the order of imprinting that correlates with the likely residual-layer information (on the basis of information related to the state of the imprint material 2 that is variable with the movement of the moving unit).

Hence, the nonuniformity in the thickness of the residual layer 2b included in the imprint-material pattern 2a can be made lower than in a case where the fourth embodiment is not applied. In the fourth embodiment, the nonuniformity in the thickness of the residual layer 2b that cannot fully be reduced in a method of adjusting the inclination of the mold 7 simply in accordance with the inclination of the substrate 3 (as disclosed by Japanese Patent Laid-Open No. 2005-10201) can also be reduced. Furthermore, even if the state of the residual layer 2b is not constant or the inclination of the plane at the top of the imprint material 2 is not constant with respect to the inclination of the substrate 3 despite the substrate stage 9 moving in a constant direction, the nonuniformity in the thickness of the residual layer 2b included in the imprint-material pattern 2a can be reduced.

Occasionally, the substrate 3 having the imprint material 2 applied thereto by the dispenser 15 may move to the imprinting position without taking the shortest route. In such a case, taking into account the length and the direction of movement up to the imprinting position as well, the way the plane at the top of the imprint material 2 changes or the way the likely residual-layer information changes may be calculated.

The information related to the order of pattern formation only needs to be information that clarifies the positional relationship between the shot area 23 and the shot areas 24. That is, any information other than the information related to the order of imprinting may also be taken.

For example, comparing the position of a shot area 20 on which a pattern has been formed in an n-th order and the position of a shot area 20 on which a pattern is to be formed in an n+1-th order, information indicating whether or not the direction from the shot area 20 on which the pattern has been formed in the n-th order toward the shot area 20 on which the pattern is to be formed in the n+1-th order is the same as the direction of movement of the substrate stage 9 (information related to the positional relationship between patterns that are formed successively) may be taken. Alternatively, information indicating whether or not any shot areas 24 are present on the leading side of the substrate stage 9 with respect to the shot area 23 (information indicating the presence of the second area on the leading side with respect to the first area) may be taken. Alternatively, information indicating where in the XY plane the shot areas 24 are present (information related to the position of the second area) may be taken. Furthermore, if a member (not illustrated) that supplies inert gas to an area around the imprinting position so as to push away the ambient air is provided, information related to the position of that member may also be taken.

Fifth Embodiment

In a fifth embodiment of the present invention, the nonuniformity in the thickness of the residual layer 2b is reduced by combining the adjustment of the inclination of the mold 7 according to the fourth embodiment and the adjustment of the amount of application of the imprint material 2 using the droplet pattern created on the basis of the order of imprinting. The fifth embodiment is suitable in a case where the nonuniformity in the thickness of the residual layer 2b is not negligible even after the inclination of the mold 7 is adjusted.

The storage unit 19 stores a program summarized as a flow chart illustrated in FIG. 16 to be referred to later. When the creating unit 25 runs the program, a droplet pattern is created.

Figure 14:
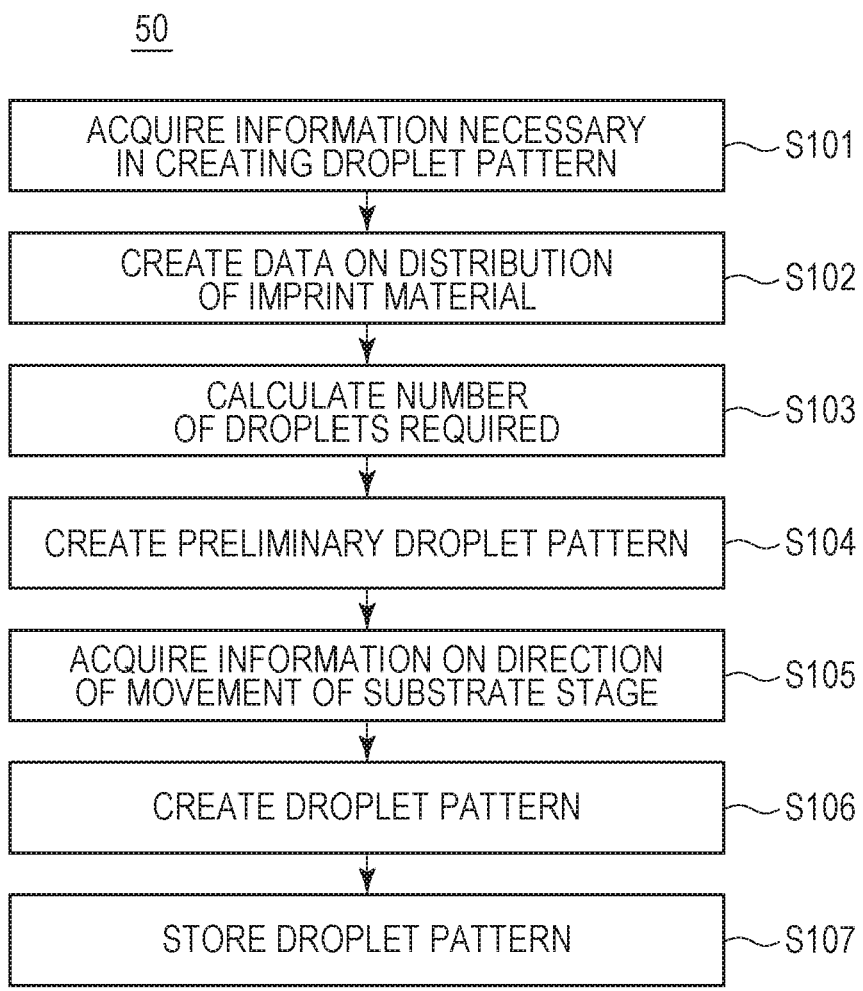
FIG. 14 is a flow chart illustrating a method of creating a droplet pattern.

FIG. 14 is a flow chart illustrating a process 50 in which the creating unit 25 creates a droplet pattern that is created before the imprinting process is performed. In step S101, the creating unit 25 acquires pieces of information necessary in creating a droplet pattern: namely, the mold information, the dispenser information, the imprinting-atmosphere information, and so forth. In step S102, the creating unit 25 creates data on the distribution of imprint material 2, which is an estimation of the required amount of imprint material 2 for each of sections of a single shot area 20, on the basis of the pieces of information acquired in step S101.

Figure 15A:
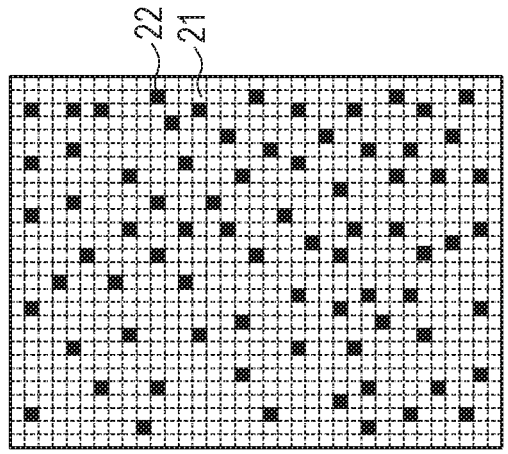
FIGS. 15A to 15C illustrate exemplary droplet patterns.

In step S103, the creating unit 25 calculates the number of droplets of imprint material 2 that is required for a single imprinting action from information indicating the size of each droplet ejected from the dispenser 15. In step S104, the calculated number of droplets are roughly allocated among the sections of the shot area 20, whereby a preliminary droplet pattern is created. An example of the preliminary droplet pattern is illustrated in FIG. 15A. The area illustrated in FIG. 15A corresponds to a single shot area 20. Blank rectangular sections 21 correspond to sections where no imprint material 2 is to be applied. Black rectangular sections 22 correspond to sections where the imprint material 2 is to be applied.

Referring to FIG. 14, in step S105, the creating unit 25 acquires the information related to the direction of movement of the substrate stage 9 and the likely residual-layer information corresponding to the information related to the direction of movement of the substrate stage 9 from the storage unit 19. In step S106, the creating unit 25 creates a droplet pattern to be set on the dispenser 15 from the likely residual-layer information and the preliminary droplet pattern that have been acquired in steps S104 and S105. The droplet pattern created in step S106 is composed of the same number of droplets of imprint material 2 as the preliminary droplet pattern, but the droplets are distributed in a different way. Step S106 is a step for reducing the nonuniformity in the thickness of the residual layer 2b that is still observed even after the adjustment of the inclination of the mold 7 according to the fourth embodiment is performed.

Figure 15B:
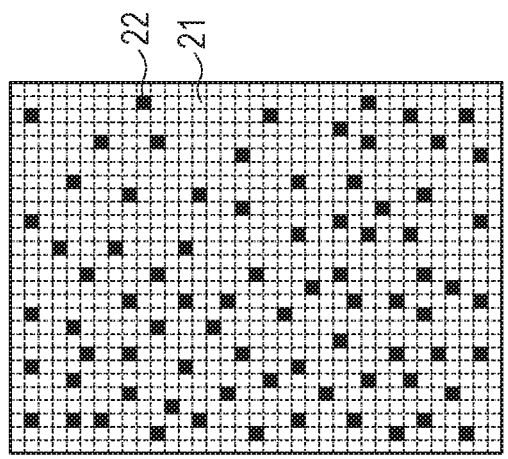

Now, step S106 will be described in further detail. If patterns are formed sequentially in the +X direction as illustrated in FIG. 13A, the residual layer 2b tends to be thicker on the leading side of the substrate stage 9 than on the trailing side of the substrate stage 9. Hence, the creating unit 25 creates a droplet pattern illustrated in FIG. 15B. With this droplet pattern, in the shot area 23, the density of the droplets of imprint material 2 (or the density of the amount of imprint material 2) to be applied (hereinafter also referred to as "application density") on the leading side on which the residual layer 2b tends to be thick is made lower than the density of the droplets of imprint material 2 to be applied on the trailing side on which the residual layer 2b tends to be thin.

Figure 15C:
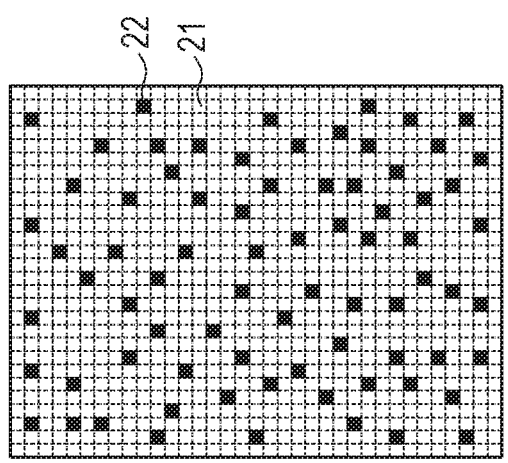

If patterns are formed sequentially in the −X direction as illustrated in FIG. 13B, the residual layer 2b tends to be thinner on the leading side of the substrate stage 9 than on the trailing side of the substrate stage 9. Hence, the creating unit 25 creates a droplet pattern illustrated in FIG. 15C. With this droplet pattern, in the shot area 23, the density of the droplets of imprint material 2 to be applied on the leading side on which the residual layer 2b tends to be thin is made higher than the density of the droplets of imprint material 2 to be applied on the trailing side on which the residual layer 2b tends to be thick.

The creating unit 25 creates a plurality of droplet patterns for one kind of mold information, because different droplet patterns need to be created for different kinds of likely residual-layer information. Furthermore, in the imprinting process, part of the relief pattern of the mold 7 may occasionally protrude from the substrate 3. Therefore, a droplet pattern with which the imprint material 2 is prevented from being ejected toward such protruding part of the relief pattern also needs to be created.

Figure 16:
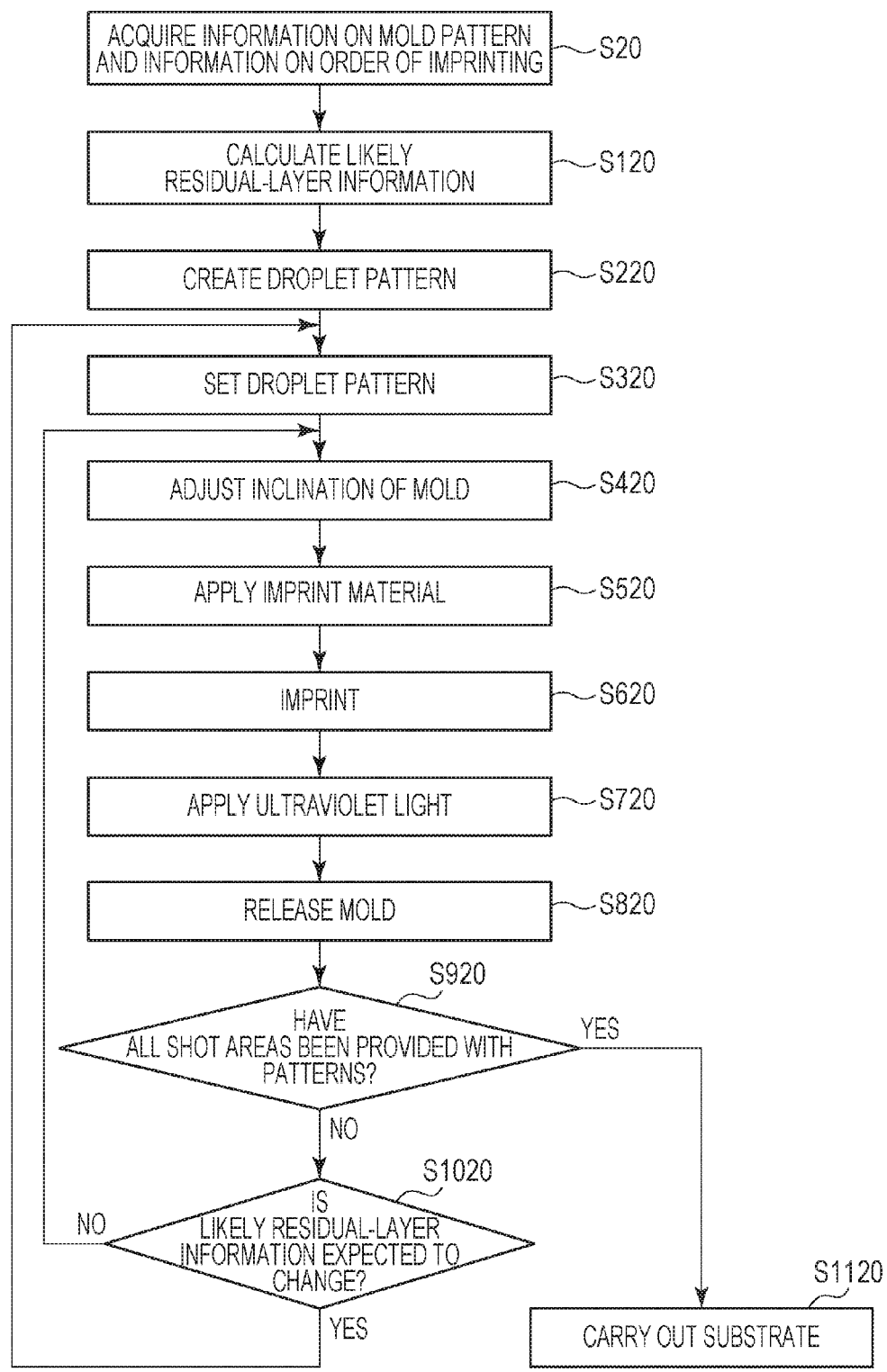
FIG. 16 is a flow chart illustrating an imprinting process according to a fifth embodiment of the present invention.

FIG. 16 is a flow chart illustrating a program of the imprinting process in which the adjustment of the inclination of the mold 7 according to the fourth embodiment and the adjustment of the amount of application of the imprint material 2 using the droplet pattern created on the basis of the order of imprinting are combined. The control unit 17 runs the program illustrated in FIG. 16.

In step S20, the mold 7 is mounted on the mold stage 6, and the control unit 17 acquires the information related to the pattern of the mold 7 and the information related to the order of imprinting. In step S120, the likely residual-layer information that indicates the tendency of the residual layer 2b that is likely to be formed in each of the shot areas 20 is calculated on the basis of the order of imprinting. In step S220, the creating unit 25 creates a droplet pattern in accordance with the process 50 described above, taking into account the reduction in the nonuniformity in the thickness of the residual layer 2b that has been realized as a result of adjustment of the inclination of the mold 7 by the mold stage 6. In the droplet pattern created in step S220, there is a difference in the application density between that on the leading side and that on the trailing side.

In step S320, the control unit 17 sets, on the dispenser 15, a droplet pattern that is suitable for the shot area 20 of interest. Furthermore, the inclination of the mold 7 is adjusted in a direction that is suitable for the shot area 20 of interest, i.e., in a direction in which the nonuniformity in the thickness of the residual layer 2b is reduced. Steps S520 to S920 are the same as steps S400 to S800 illustrated in FIG. 7, and step S1120 is the same as step S1000 illustrated in FIG. 7. Therefore, description of these steps is omitted.

In step S920, after the formation of the pattern on a single shot area 20, if the control unit 17 has determined that not all of the shot areas 20 undergo the imprinting process, the process proceeds to step S1020, in which the control unit 17 checks if the likely residual-layer information is expected to change in the next shot area 20 of interest. If it is determined that the likely residual-layer information is expected to change (YES), the process returns to step S320, in which another droplet pattern is set. Then, in step S420, the mold stage 6 adjusts the inclination of the mold 7 in accordance with the new likely residual-layer information. If the likely residual-layer information is not expected to change, the process returns to step S420, in which the imprinting process is continued with the same droplet pattern and with the same degree of inclination of the mold 7.

The flow of the imprinting process according to the fifth embodiment has been described above. In the fifth embodiment, the nonuniformity in the thickness of the residual layer 2b is reduced by combining the adjustment of the inclination of the mold 7 and the adjustment of the amount of application of the imprint material 2 using the droplet pattern created on the basis of the order of imprinting. Thus, the nonuniformity in the thickness of the residual layer 2b that is not negligible even after the inclination of the mold 7 is adjusted can be reduced. Furthermore, in a case where the residual layer 2b has locally thick part in the shot area 23 of interest even if imprinting is performed with the mold 7 being inclined, the nonuniformity in the thickness of the residual layer 2b can be reduced, so that the thickness of the residual layer 2b becomes uniform, by changing the application density of the droplet pattern.

Sixth Embodiment

In a sixth embodiment of the present invention, the mold stage 6 adjusts the inclination of the mold 7 on the basis of information related to the speed of movement of the substrate stage 9 along the horizontal plane as well. The information related to the speed of the substrate stage 9 is information indicating the level of the speed or the rate of acceleration or the like of the substrate stage 9.

With the application of the sixth embodiment to the first embodiment, the nonuniformity in the thickness of the residual layer 2b can be reduced to a desired level also in a case where the inclination of the substrate stage 9 at the imprinting position varies with the speed of the substrate stage 9.

Furthermore, with the application of the sixth embodiment to the fourth embodiment, the nonuniformity in the thickness of the residual layer 2b can be reduced to a desired level also in a case where the nonuniformity in the thickness of the residual layer 2b that may occur in accordance with the order of imprinting varies with the speed of the substrate stage 9.

OTHER EMBODIMENTS

Other embodiments of the present invention will now be described. The first to sixth embodiments may be combined in any way. The imprinting apparatus 1 according to any of the embodiments of the present invention may include a plurality of dispensers 15. In that case, the direction from the position facing any of the dispensers 15 that has ejected the imprint material 2 to a shot area 20 of interest toward the imprinting position is regarded as the direction of movement of the substrate stage 9.

While the above embodiments each concerns a case where the inclination of the mold 7 is adjusted, the adjusting unit only needs to be capable of adjusting the inclination of the mold with respect to the substrate. That is, the inclination of at least one of the mold 7 and the substrate 3 only needs to be adjusted.

If different dispensers 15 are used for different positions of the shot area 23 of the substrate 3, the number of pieces of likely residual-layer information increases. Even in such a case, both the nonuniformity in the thickness of the residual layer 2b in a single shot area 20 and the nonuniformity in the thickness of the residual layer 2b among a plurality of shot areas 20 can be reduced.

The direction of movement of the substrate stage 9 is determined by the position of the shot area 20 of interest on the substrate 3, the position of the dispenser 15, and the imprinting position. The order of imprinting is not limited to those illustrated in FIGS. 3A and 3B. Imprinting may be performed in a random order, a zigzag order, or the like. The control unit 17 and the storage unit 19 may be provided on a single control board or on separate control boards, respectively, as long as the units 17 and 19 exert the respective functions described above.

While the first to sixth embodiments each concern an optical imprinting method in which the imprint material 2, which is curable with light, is cured with the application of the ultraviolet light 4 thereto, the present invention is not limited to such an imprinting method. The imprint material 2 may be a material that is curable with any kind of electromagnetic radiation including light, or a material that is curable with heat.

Article Manufacturing Method

A method of manufacturing an article (a semiconductor integrated-circuit device, a liquid-crystal-display device, an imaging device, a magnetic head, a compact disc rewritable (CD-RW), an optical device, a photomask, or the like) according to an embodiment of the present invention includes a step of forming a pattern on a substrate 3 (a monocrystalline silicon wafer, a silicon on insulator (SOI), a glass plate, or the like) by using the imprinting apparatus 1, and a step of performing at least one of etching and ion implantation on the substrate 3 having the pattern. The method may further include any known processing steps (oxidization, film formation, deposition, planarization, resist stripping, dicing, bonding, packaging, and so forth).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-074494, filed Mar. 31, 2015, which is hereby incorporated by reference herein in its entirety.

What is claimed is:

1. An imprinting apparatus that forms patterns of imprint material on a plurality of shot areas of a substrate by making a pattern of a mold in contact with imprint material on respective shot areas of the plurality of shot areas, the apparatus comprising:
   a stage configured to incline at least one of the mold and the substrate to adjust relative angle between the mold and the substrate,
   wherein, when patterns of imprint material is formed on a first plurality of shot areas in order in a first direction on the substrate, the stage inclines the at least one of the mold and the substrate to adjust the relative angle so that a gap between the mold and the substrate on a downstream portion in the first direction is smaller than the gap between the mold and the substrate on an upper stream portion in the first direction while the pattern of the mold contacts with imprint material, and
   wherein, when patterns of imprint material is formed on a second plurality of shot areas in order in a second direction opposite to the first direction on the substrate, the stage inclines the at least one of the mold and the substrate to adjust the relative angle so that a gap between the mold and the substrate on a downstream portion in the second direction is smaller than the gap between the mold and the substrate on an upper stream portion in the second direction.

2. The apparatus according to claim 1, further comprising:
   a moving unit configured to move the substrate; and
   a supply unit configured to supply the imprint material onto the substrate,
   wherein the stage inclines the at least one of the mold and the substrate to adjust the relative angle based on a direction of movement of the moving unit from a position facing the supply unit to a position facing the mold.

3. The apparatus according to claim 1, further comprising:
   a moving unit configured to move the substrate,
   wherein the stage inclines the at least one of the mold and the substrate to adjust the relative angle based on information related to a speed of the moving unit.

4. The apparatus according to claim 1, further comprising:
   a supply unit configured to supply the imprint material onto the substrate;
   a creating unit configured to create data of a distribution of imprint material on the shot area.

* * * * *